United States Patent
Uchida et al.

(10) Patent No.: US 9,681,590 B2
(45) Date of Patent: Jun. 13, 2017

(54) COOLING SYSTEM WITH CONTROLLED APPORTIONING OF THE COOLED HIGH PRESSURE REFRIGERANT BETWEEN THE CONDENSER AND THE EXPANSION VALVE

(75) Inventors: Kazuhide Uchida, Hamamatsu (JP); Yuichi Ohno, Nishio (JP); Yoshiaki Kawakami, Nagoya (JP); Yuki Jojima, Nagoya (JP); Eizo Takahashi, Chiryu (JP); Kousuke Sato, Toyota (JP)

(73) Assignees: TOYOTA JIDOSHA KABUSHIKI KAISHA, Toyota-shi (JP); NIPPON SOKEN, INC, Nishio (JP)

( * ) Notice: Subject to any disclaimer, the term of this patent is extended or adjusted under 35 U.S.C. 154(b) by 187 days.

(21) Appl. No.: 14/004,574

(22) PCT Filed: Mar. 16, 2012

(86) PCT No.: PCT/IB2012/000515
§ 371 (c)(1),
(2), (4) Date: Sep. 11, 2013

(87) PCT Pub. No.: WO2012/123812
PCT Pub. Date: Sep. 20, 2012

(65) Prior Publication Data
US 2014/0007613 A1    Jan. 9, 2014

(30) Foreign Application Priority Data
Mar. 16, 2011   (JP) .................................. 2011-057587

(51) Int. Cl.
*F25B 39/04*   (2006.01)
*F25B 43/00*   (2006.01)
(Continued)

(52) U.S. Cl.
CPC ......... *H05K 7/20881* (2013.01); *B60H 1/004* (2013.01); *F01P 9/02* (2013.01); *B60H 2001/00949* (2013.01)

(58) Field of Classification Search
CPC .. F25B 2400/16; F25B 2400/23; F25B 41/04; B60H 1/004; B60H 2001/00949; H05K 7/20881; F01P 9/02
USPC .................................................... 62/509, 512
See application file for complete search history.

(56) References Cited

U.S. PATENT DOCUMENTS 4,633,674 A * 1/1987 Sato ................................. 62/197
5,056,329 A * 10/1991 Wilkinson ...................... 62/197
(Continued)

FOREIGN PATENT DOCUMENTS

JP   62-102964 U1   6/1987
JP   04-093557 A    3/1992
(Continued)

OTHER PUBLICATIONS

Partial translation (English) of Office Action issued to Japanese Application No. 2011-057587, Jul. 22, 2014.

*Primary Examiner* — Allen Flanigan
*Assistant Examiner* — Filip Zec
(74) *Attorney, Agent, or Firm* — Andrews Kurth Kenyon LLP

(57) ABSTRACT

A cooling system that cools HV equipment includes a compressor that circulates refrigerant, a condenser that condenses the refrigerant, a gas-liquid separator that stores the refrigerant in liquid form that is condensed by the condenser, an expansion valve that reduces a pressure of the refrigerant, an evaporator that vaporizes the refrigerant that is reduced in pressure by the expansion valve, a first passage and a second passage through which the refrigerant flows from the gas-liquid separator toward the expansion valve, and that are
(Continued)

provided in parallel, and a cooling portion that is provided along the second passage and cools the heat source using the refrigerant. The refrigerant in liquid form flows from the gas-liquid separator through the second passage.

10 Claims, 6 Drawing Sheets

(51) Int. Cl.
  *H05K 7/20* (2006.01)
  *B60H 1/00* (2006.01)
  *F01P 9/02* (2006.01)

(56) References Cited

U.S. PATENT DOCUMENTS

| | | | |
|---|---|---|---|
| 6,405,559 B1 * | 6/2002 | Yoneda | 62/513 |
| 6,427,480 B1 * | 8/2002 | Ito et al. | 62/509 |
| 6,981,390 B2 * | 1/2006 | Yamada et al. | 62/509 |
| 7,267,084 B2 * | 9/2007 | Lutze | F01P 3/20 123/41.02 |
| 7,506,518 B2 * | 3/2009 | Mizutani et al. | 62/131 |
| 7,650,753 B2 * | 1/2010 | Muller et al. | F01P 7/165 123/41.31 |
| 2005/0229629 A1 | 10/2005 | Burk et al. | |

FOREIGN PATENT DOCUMENTS

| | | |
|---|---|---|
| JP | 04-061262 U1 | 5/1992 |
| JP | 2000-073763 A | 3/2000 |
| JP | 2007-069733 A | 3/2001 |
| JP | 2005-090862 A | 4/2005 |
| JP | 2006-097978 A | 4/2006 |
| JP | 2012-163240 A | 8/2012 |
| WO | 2004/055450 | 7/2004 |
| WO | 2012/104696 A1 | 8/2012 |

* cited by examiner

COOLING SYSTEM WITH CONTROLLED APPORTIONING OF THE COOLED HIGH PRESSURE REFRIGERANT BETWEEN THE CONDENSER AND THE EXPANSION VALVE

CROSS REFERENCE TO RELATED APPLICATIONS

This is a national phase application based on the PCT International Patent Application No. PCT/IB2012/000515 filed on Mar. 16, 2012, which claims foreign priority to Japanese Patent Application No. 2011-057587 filed on Mar. 16, 2011, the entire contents of which are incorporated herein by reference.

BACKGROUND OF THE INVENTION

1. Field of the Invention

The invention relates to a cooling system. More particularly, the invention relates to a cooling system that is capable of cooling a heat source using a vapor compression refrigeration cycle.

2. Description of Related Art

In recent years, hybrid vehicles, fuel cell vehicles, and electric vehicles and the like that run using the driving force of an electric motor have become attractive as a way to address environmental concerns. In these types of vehicles, electrical equipment such as a motor, generator, inverter, converter, and battery generate heat by the sending and receiving electric power. Therefore, this electrical equipment must be cooled.

Japanese Patent Application Publication No. 2000-73763 (JP 2000-73763 A) describes a hybrid vehicle cooling system that includes a first cooling circuit that selectively or simultaneously cools an engine cylinder head and a driving motor, a second cooling circuit that cools an engine cylinder block, and a third cooling circuit that cools a power system control unit that drive-controls the driving motor.

The cooling system described in JP 2000-73763 A cools electrical system parts using a system that circulates coolant between a heat generating body and a radiator, similar to a normal vehicle that cools only an engine. In this kind of system, a radiator for cooling the electrical system parts must be newly provided, so mountability in a vehicle is poor.

Therefore, technology that cools a heat generating body using a vapor compression refrigeration cycle that is used for a vehicle air conditioning system has been proposed. For example, Japanese Patent Application Publication No. 2007-69733 (JP 2007-69733 A) describes a system that cools a heat generating body using refrigerant for an air conditioning system, and in which a heat exchanger that performs heat exchange with air for air conditioning, and a heat exchanger that performs heat exchange with the heat generating body, are arranged in parallel in a refrigerant passage that leads from an expansion valve to a compressor. Also, Japanese Patent Application Publication No. 2005-90862 (JP 2005-90862 A) describes a cooling system provided with heat generating body cooling means for cooling a heat generating body, in a bypass passage that bypasses a compressor, an evaporator, and a pressure reducer of an air conditioning refrigeration cycle.

With the cooling systems described in JP 2007-69733 A and JP 2005-90862 A, a cooling path for cooling a heat source such as electrical equipment is incorporated into a vapor compression refrigeration cycle, and when cooling the heat source, refrigerant in a two-phase gas-liquid state after passing through the pressure reducer is introduced into a refrigerant path that cools the heat source. Therefore, cooling performance for the heat source will become unstable if the amount of liquid-phase refrigerant decreases when a sudden load fluctuation occurs. Also, of the refrigerant in the two-phase gas-liquid state, the flowrate of the gas-phase refrigerant will become faster, so pressure loss as well as power consumption of the compressor for circulating the refrigerant will increase.

SUMMARY OF THE INVENTION

This invention therefore provides a cooling system capable of both stably cooling a heat source and reducing power loss.

A first aspect of the invention relates to a cooling system. This cooling system includes a compressor that circulates refrigerant, a condenser that condenses the refrigerant, a liquid storing container that stores the refrigerant in liquid form that is condensed by the condenser, a pressure reducer that reduces a pressure of the refrigerant, an evaporator that vaporizes the refrigerant that is reduced in pressure by the pressure reducer, a first passage and a second passage through which the refrigerant flows from the liquid storing container toward the pressure reducer, and that are provided in parallel, and a cooling portion that is provided along the second passage and cools a heat source using the refrigerant. The refrigerant in liquid form flows from the liquid storing container through the second passage.

The cooling system may also include a flow control valve that is arranged in the first passage and regulates a flowrate of the refrigerant that flows through the first passage and a flowrate of the refrigerant that flows through the second passage.

The cooling system may also include a third passage through which the refrigerant flows from the compressor toward the condenser, and a communicating passage that communicates the third passage with a portion of the second passage that is downstream of the cooling portion. Preferably, the cooling system may further include a changeover valve that switches a communication state between the third passage and the portion of the second passage that is downstream of the cooling portion. The cooling portion may be arranged lower than the condenser.

The cooling system may also include a second condenser provided in a path through which the refrigerant flows from the cooling portion toward the pressure reducer. The condenser may have a greater heat releasing capability to release heat from the refrigerant than the second condenser does.

The cooling system may also have a filter arranged upstream of the cooling portion in the second passage. The filter may be attached to an upstream end portion of the second passage.

In the cooling system described above, an upstream end portion of the second passage may be arranged in a liquid phase inside the liquid storing container.

In the cooling system described above, an upstream end portion of the first passage may be arranged in a gas phase inside the liquid storing container.

The cooling system of the invention makes it possible to stably cool a heat source even when a load fluctuates, and reduce power loss related to circulating refrigerant, by cooling the heat source by supplying refrigerant in a saturated liquid state.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
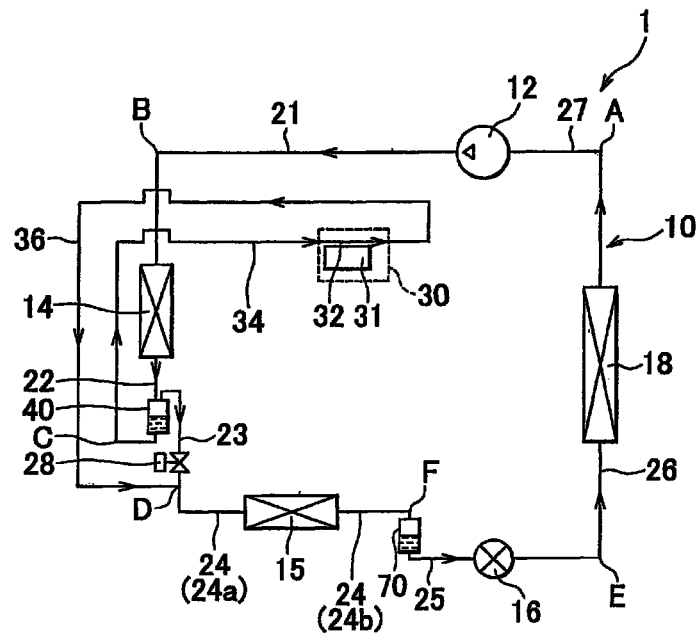
FIG. 1 is a view showing a frame format of the structure of a cooling system according to a first example embodiment of the invention.

Example embodiments of the invention will be described below with reference to the accompanying drawings. In the following description, like or corresponding parts will be denoted by like reference characters, and detailed descriptions of those parts will not be repeated.

First Example Embodiment

FIG. 1 is a view of a frame format showing the structure of a cooling system 1 according to a first example embodiment of the invention. As shown in FIG. 1, the cooling system 1 includes a vapor compression refrigeration cycle 10. This vapor compression refrigeration cycle 10 is provided in a vehicle in order to cool the interior of the vehicle, for example. Cooling using the vapor compression refrigeration cycle 10 is performed when, for example, a switch for performing cooling is turned on, or when an automatic control mode that automatically adjusts the temperature in the cabin of the vehicle so that it comes to match a set temperature is selected and the temperature in the vehicle cabin is higher than the set temperature.

The vapor compression refrigeration cycle 10 includes a compressor 12, a condenser (a first condenser) 14, a condenser 15 that serves as a second condenser, an expansion valve 16 that serves as an example of a pressure reducer, and an evaporator 18. The vapor compression refrigeration cycle 10 also includes a gas-liquid separator 40 that is arranged between the outlet side of the condenser 14 and the inlet side of the condenser 15, and a receiver 70 that is arranged between the outlet side of the condenser 15 and the inlet side of the expansion valve 16.

The vapor compression refrigeration cycle 10 also includes a refrigerant passage 21 that serves as a third passage that communicates the compressor 12 with the condenser 14, refrigerant passages 22, 23, and 24a that communicate the condenser 14 with the condenser 15, refrigerant passages 24b and 25 that communicate the condenser 15 with the expansion valve 16, a refrigerant passage 26 that communicates the expansion valve 16 with the evaporator 18, and a refrigerant passage 27 that communicates the evaporator 18 with the compressor 12. The vapor compression refrigeration cycle 10 is formed by the compressor 12, the condensers 14 and 15, the expansion valve 16, and the evaporator 18 being connected together by the refrigerant passages 21 to 27.

The compressor 12 operates with an electric motor or an engine mounted in the vehicle as the power source, and adiabatically compresses refrigerant gas to create superheated refrigerant gas. When operating, the compressor 12 draws in and compresses gas-phase refrigerant that flows through the refrigerant passage 24 from the evaporator 18, and discharges it into the refrigerant passage 21. The compressor 12 circulates the refrigerant in the vapor compression refrigeration cycle 10 by discharging the refrigerant into the refrigerant passage 21.

The condensers 14 and 15 isobarically release heat from the superheated refrigerant gas that has been compressed in the compressor 12 to an external medium, thus creating refrigerant liquid. The high-pressure gas-phase refrigerant discharged from the compressor 12 is condensed (i.e., liquefied) by being cooled through releasing its heat to the surroundings in the condensers 14 and 15. The condensers 14 and 15 each include a tube through which refrigerant flows, and fins for performing heat exchange between the refrigerant that flows through the tube and the surrounding air in the condensers 14 and 15. The condensers 14 and 15 perform heat exchange between the refrigerant and cool air supplied by the natural flow of air produced as the vehicle runs, or by a forced draft from a cooling fan such as a radiator fan for cooling an engine. The temperature of the refrigerant drops from the heat exchange in the condensers 14 and 15, and as a result, the refrigerant becomes liquefied.

The expansion valve 16 injects the high-pressure liquid-phase refrigerant that flows through the refrigerant passage 25 from a small hole so that it expands and changes to low-temperature, low-pressure atomized refrigerant. The expansion valve 16 reduces the pressure of the refrigerant liquid that has been condensed by the condensers 14 and 15, thereby creating wet vapor of a gas-liquid mixture. The pressure reducer for reducing the pressure of the refrigerant liquid is not limited to being the expansion valve 16 that throttles and expands. That is, it may be a capillary instead.

The evaporator 18 absorbs the heat in the surrounding air that has been introduced so as to contact the evaporator 18, by the atomized refrigerant that flows through the evaporator 18 being vaporized. The evaporator 18 cools the inside of a vehicle cabin by absorbing the vaporization heat when the wet vapor of the refrigerant vaporizes and becomes refrigerant gas from the air in the vehicle cabin that is a portion to be cooled, using the refrigerant that has been reduced in pressure by the expansion valve 16. The inside of the vehicle cabin is cooled by the air, whose temperature has been reduced by the heat being absorbed by the evaporator 18, being returned again into the vehicle cabin. The refrigerant is heated by absorbing heat from the surroundings in the evaporator 18.

The evaporator 18 includes a tube through which refrigerant flows, and fins for performing heat exchange between the refrigerant that flows through the tube and the surrounding air in the evaporator 18. Refrigerant in a wet vapor state flows through the tube. When the refrigerant flows through the tube, it vaporizes by absorbing the heat of the air inside the vehicle cabin as latent heat of vaporization via the fins, and then becomes superheated vapor by sensible heat. The vaporized refrigerant flows into the compressor 12 through the refrigerant passage 27. The compressor 12 compresses the refrigerant that flows in from the evaporator 18.

The refrigerant passage 21 is a passage for leading refrigerant from the compressor 12 to the condenser 14. The refrigerant flows from the outlet of the compressor 12 toward the inlet of the condenser 14 via the refrigerant passage 21. The refrigerant passages 22 to 25 are passages for leading refrigerant from the condenser 14 to the expansion valve 16. The refrigerant flows from the outlet of the condenser 14 toward the inlet of the expansion valve 16 via the refrigerant passages 22 to 25. The refrigerant passage 26 is a passage for leading refrigerant from the expansion valve 16 to the evaporator 18. The refrigerant flows from the outlet of the expansion valve 16 toward the inlet of the evaporator 18 via the refrigerant passage 26. The refrigerant passage 27 is a passage for leading refrigerant from the evaporator 18 to the compressor 12. The refrigerant flows from the outlet of the evaporator 18 toward the inlet of the compressor 12 via the refrigerant passage 27.

The refrigerant circulates through the vapor compression refrigeration cycle 10 by passing through a refrigerant circulation flow path in which the compressor 12, the condensers 14 and 15, the expansion valve 16, and the evaporator 18 are connected in that order by the refrigerant passages 21 to 27. Refrigerant flows so as to pass through points A, B, D, F, and E in that order, shown in FIG. 1, inside the vapor compression refrigeration cycle 10, such that refrigerant circulates to the compressor 12, the condensers 14 and 15, the expansion valve 16, and the evaporator 18.

Carbon dioxide, a hydrogen oxide such as propane or isobutane, ammonia, or water, for example, may be used as the refrigerant of the vapor compression refrigeration cycle 10.

Figure 2:
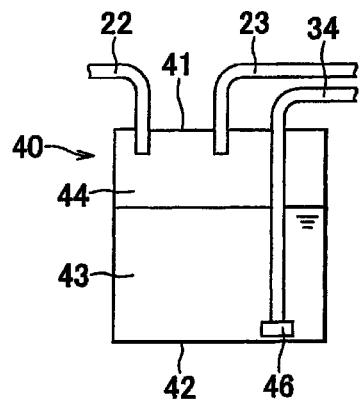
FIG. 2 is a view showing a frame format of the general structure of a gas-liquid separator.

The gas-liquid separator 40 separates the refrigerant that flows out from the condenser 14 into gas-phase refrigerant and liquid-phase refrigerant. FIG. 2 is a view of a frame format showing the general structure of the gas-liquid separator 40. As shown in FIG. 2, the gas-liquid separator 40 has a ceiling portion 41, and a bottom portion 42. Inside the gas-liquid separator 40 are stored refrigerant liquid 43 that is liquid-phase refrigerant, and refrigerant vapor 44 that is gas-phase refrigerant. The refrigerant liquid 43 is stored on the bottom portion 42 side of the gas-liquid separator 40, and the refrigerant vapor 44 is stored on the ceiling portion 41 side of the gas-liquid separator 40.

The refrigerant passages 22 and 23 and a refrigerant passage 34 pass through a space inside the gas-liquid separator 40. The refrigerant passages 22, 23, and 34 communicate the inside of the gas-liquid separator 40 with the outside of the gas-liquid separator 40. The refrigerant passage 22, 23, and 34 are arranged extending from the inside of the gas-liquid separator 40 to the outside of the gas-liquid separator 40 through the ceiling portion 41 of the gas-liquid separator 40. An end portion of the refrigerant passage 22 is arranged in the gas phase inside the gas-liquid separator 40. An end portion of the refrigerant passage 23 is arranged in the gas phase inside the gas-liquid separator 40. An end portion of the refrigerant passage 34 is arranged in the liquid phase inside the gas-liquid separator 40.

On the outlet side of the condenser 14, the refrigerant is in a wet vapor state of the two-phase gas-liquid state in which saturated liquid and saturated vapor are mixed. The refrigerant that flows out from the condenser 14 is supplied to the gas-liquid separator 40 through the refrigerant passage 22. The refrigerant that is in the two-phase gas-liquid state that flows into the gas-liquid separator 40 from the refrigerant passage 22 is separated into a gas phase and a liquid phase inside the gas-liquid separator 40. The gas-liquid separator 40 separates the refrigerant that has been condensed by the condenser 14 into the refrigerant liquid 43 that is in liquid form and the refrigerant vapor 44 that is in gas form, and stores them temporarily.

The separated refrigerant liquid 43 flows out of the gas-liquid separator 40 through the refrigerant passage 34. An end portion of the refrigerant passage 34 that is arranged in the liquid phase inside the gas-liquid separator 40 forms an outlet from the gas-liquid separator 40 for the liquid-phase refrigerant. The separated refrigerant vapor 44 flows out of the gas-liquid separator 40 through the refrigerant passage 23. An end portion of the refrigerant passage 23 that is arranged in the gas phase inside the gas-liquid separator 40 forms an outlet from the gas-liquid separator 40 for the gas-phase refrigerant.

Inside the gas-liquid separator 40, the refrigerant liquid 43 collects on the lower side and the refrigerant vapor 44 collects on the upper side. An end portion of the refrigerant passage 34 that leads the refrigerant liquid 43 out of the gas-liquid separator 40 is arranged near the bottom portion 42 of the gas-liquid separator 40. The end portion of the refrigerant passage 34 is submerged in the refrigerant liquid 43, such that only the refrigerant liquid 43 is delivered out of the gas-liquid separator 40 from the bottom side of the gas-liquid separator 40 through the refrigerant passage 34. An end portion of the refrigerant passage 23 that leads the refrigerant vapor 44 from the gas-liquid separator 40 is arranged near the ceiling portion 41 of the gas-liquid separator 40. The end portion of the refrigerant passage 23 is in the gas-phase refrigerant vapor 44, such that only the refrigerant vapor 44 is delivered out of the gas-liquid separator 40 from the ceiling side of the gas-liquid separator 40 through the refrigerant passage 23. As a result, the gas-liquid separator 40 is able to reliably separate the gas-phase refrigerant and the liquid-phase refrigerant.

The gas-phase refrigerant vapor 44 that has been led out of the gas-liquid separator 40 condenses by being cooled through releasing its heat to the surroundings in the condenser 15. This condensed refrigerant then flows into the receiver 70 through the refrigerant passage 24b. The receiver 70 is connected between the downstream side of the condenser 15 and the upstream side of the expansion valve 16, and temporarily stores refrigerant liquid that has been condensed by passing through the condenser 15, so that refrigerant can be supplied to the evaporator 18 according to the load. The receiver 70 also gas-liquid separates the refrigerant that flows out of the condenser 15 into gas-phase refrigerant and liquid-phase refrigerant, and allows only the liquid-phase refrigerant to flow out toward the expansion valve 16.

Figure 3:
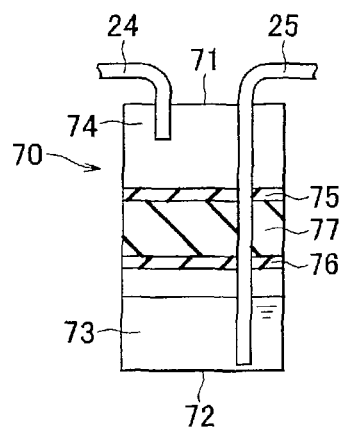
FIG. 3 is a view showing a frame format of the general structure of a receiver.

FIG. 3 is a view of a frame format showing the general structure of the 70. As shown in FIG. 3, the receiver 70 has a ceiling portion 71 and a bottom portion 72. A strainer 75, a drying agent 77, and a strainer 76 are stacked in that order from the ceiling portion 71 toward the bottom portion 72 in a space inside the receiver 70. The drying agent 77 may be silica. The space inside the receiver 70 is divided into an upper space on the ceiling portion 71 side and a lower space on the bottom portion 72 side by the stacked structure of the strainers 75 and 76 and the drying agent 77.

Refrigerant liquid 73 that is liquid-phase refrigerant and refrigerant gas 74 that is gas-phase refrigerant are stored inside the receiver 70. The refrigerant liquid 73 accumulates on the bottom portion 72 side of the receiver 70, and the refrigerant gas 74 collects on the ceiling portion 71 side of the receiver 70. The refrigerant passages 24 and 25 extend into the space inside of the receiver 70. The refrigerant passages 24 and 25 communicate the inside of the receiver 70 with the outside of the receiver 70. The refrigerant passage 24 and 25 are arranged extending from the inside of the receiver 70 to the outside of the receiver 70 via the ceiling portion of the receiver 70. An end portion of the refrigerant passage 24 is arranged in an upper space inside the receiver 70. An end portion of the refrigerant passage 25 is arranged in a lower space inside the receiver 70.

At the outlet of the condenser 15, the refrigerant is in a liquid state. The refrigerant that flows out from the condenser 15 is supplied to the upper space in the receiver 70 through the refrigerant passage 24, and drops down to the lower space inside the receiver 70 via the strainer 75, the drying agent 77, and the strainer 76, in that order.

The liquid refrigerant is filtered by flowing through the strainers 75 and 76. Foreign matter in the refrigerant is unable to pass through the strainers 75 and 76, so this foreign matter is removed from the refrigerant. Moisture is removed from the refrigerant by the refrigerant passing through the drying agent 77. The drying agent 77 functions as a moisture adsorbent that adsorbs moisture in the refrigerant. Only the refrigerant in liquid form moves from the upper space to the lower space of the receiver 70 through the stacked structure of the strainers 75 and 76 and the drying agent 77. The air in the refrigerant remains in the upper space, so the air in the refrigerant is removed from the refrigerant.

In the refrigerant operating temperature range, the air does not change states like the refrigerant, so if there is air in the refrigerant, it will impede the heat exchange of the refrigerant in the condensers 14 and 15 and the evaporator 18, causing the cooling capability of the refrigeration cycle to decline. Moisture in the refrigerant corrodes parts, and freezes in the expansion valve 16, impeding the flow of refrigerant. If foreign matter becomes stuck in the small hole in the expansion valve 16, the flow of refrigerant becomes impeded, and the vapor compression refrigeration cycle 10 will not operate. Therefore, by providing the receiver 70 between the condenser 15 and the expansion valve 16, air and moisture in the refrigeration cycle can be removed, and foreign matter can be removed before the expansion valve 16, thus preventing the expansion valve 16 from becoming clogged. As a result, a decline in the refrigeration cycle performance can be prevented.

Inside the receiver 70, the refrigerant liquid 73 collects on the lower side and the refrigerant gas 74 collects on the upper side. An end portion of the refrigerant passage 25 through which refrigerant that flows out from the receiver 70 flows is arranged near the bottom portion 72. The end portion of the refrigerant passage 25 is submerged in the refrigerant liquid 73, such that only the refrigerant liquid 73 is delivered out of the receiver 70 from the bottom of the receiver 70 through the refrigerant passage 25. As a result, the receiver 70 is able to reliably separate the gas-phase refrigerant from the liquid-phase refrigerant, as well as reliably remove the air in the refrigerant.

Returning to FIG. 1, a path along which refrigerant that flows from the outlet of the condenser 14 toward the inlet of the expansion valve 16 flows includes the refrigerant passage 22 that leads from the outlet side of the condenser 14 to the space inside the gas-liquid separator 40, the refrigerant passage 23 through which the refrigerant vapor 44 flows out from the gas-liquid separator 40, the refrigerant passage 24a that is connected to the inlet side of the condenser 15, the refrigerant passage 24b that leads from the output side of the condenser 15 to the space inside the receiver 70, and the refrigerant passage 25 through which the refrigerant liquid 73 flows from the receiver 70 to the expansion valve 16. Point D shown in FIG. 1 represents a downstream end portion of the refrigerant passage 23 that serves as the first passage, i.e., an end portion of the refrigerant passage 23 that is on the side near the condenser 15. That is, point D represents a connecting point of the refrigerant passage 23 and the refrigerant passage 24a. The refrigerant passage 23 forms a portion of a path through which the refrigerant flows from the gas-liquid separator 40 toward the expansion valve 16, that extends from the gas-liquid separator 40 to point D.

The cooling system 1 includes a second passage that is connected in parallel with the refrigerant passage 23. A cooling portion 30 is provided along this second passage. The cooling portion 30 is provided in a path for refrigerant that flows from the condenser 14 toward the condenser 15. The cooling portion 30 includes HV (Hybrid Vehicle) equipment 31 that is electrical equipment mounted in the vehicle, and a cooling passage 32 that is a conduit through which refrigerant flows. The HV equipment 31 is one example of a heat source. The second passage described above includes the cooling passage 32. The second passage also includes refrigerant passages 34 and 36 that are conduits through which refrigerant flows.

The second passage through which refrigerant flows parallel to the passage forming portion 23 from the gas-liquid separator 40 toward point D in FIG. 1 is divided into the refrigerant passage 34 that is upstream (i.e., on the side near the gas-liquid separator 40) of the cooling portion 30, the cooling passage 32 that is included in the cooling portion 30, and the refrigerant passage 36 that is downstream (i.e., on the side near the condenser 15) of the cooling portion 30. The refrigerant passage 34 is a passage for leading liquid-phase refrigerant from the gas-liquid separator 40 to the cooling portion 30. The refrigerant passage 36 is a passage for leading refrigerant from the cooling portion 30 to point D. Point D is a branch point of the refrigerant passages 23 and 24 and the refrigerant passage 36.

Refrigerant is in liquid form that is discharged from the gas-liquid separator 40 and flows through the second passage flows toward the cooling portion 30 via the refrigerant passage 34. The refrigerant that flows to the cooling portion 30 and through the cooling passage 32 removes heat from the HV equipment 31 that is the heat source, thereby cooling the HV equipment 31. The cooling portion 30 cools the HV equipment 31 using the liquid-phase refrigerant that has been separated by the gas-liquid separator 40. In the cooling portion 30, heat exchange is performed between the refrigerant that flows through the cooling passage 32, and the HV equipment 31, such that the HV equipment 31 is cooled and the refrigerant is heated. The refrigerant then flows from the cooling portion 30 toward point D through the refrigerant passage 36, and then to the condenser 15 through the refrigerant passage 24a. The upstream end portion of the cooling passage 32 is connected to the refrigerant passage 34. The downstream end portion of the cooling passage 32 is connected to the refrigerant passage 36.

The cooling portion 30 is provided with a structure that enables heat exchange between the refrigerant and the HV equipment 31 at the cooling passage 32. In this example embodiment, the cooling portion 30 has the cooling passage 32 that is formed such that an outer peripheral surface of the cooling passage 32 directly contacts the case of the HV equipment 31. The cooling passage 32 has a portion that is adjacent to the case of the HV equipment 31. Heat exchange between the refrigerant that flows through the cooling passage 32 and the HV equipment 31 is possible at this portion.

The HV equipment 31 is directly connected to the outer peripheral surface of the cooling passage 32 that forms part of the refrigerant path from the condenser 14 to the expansion valve 16 of the vapor compression refrigeration cycle 10, and is thus cooled. The HV equipment 31 is arranged on an outer portion of the cooling passage 32, so the HV equipment 31 will not interfere with the flow of refrigerant that flows through the cooling passage 32. Therefore, pressure loss in the vapor compression refrigeration cycle 10 will not increase, so the HV equipment 31 is able to be cooled without increasing the power of the compressor 12.

Alternatively, the cooling portion 30 may be provided with a suitable well-known heat pipe interposed between the HV equipment 31 and the cooling passage 32. In this case, the HV equipment 31 is connected to an outer peripheral surface of the cooling passage 32 via the heat pipe, and is cooled by heat being transferred from the HV equipment 31 to the cooling passage 32 via the heat pipe. By making the HV equipment 31 the heating portion of the heat pipe, and the cooling passage 32 the cooling portion of the heat pipe, heat-transfer efficiency between the cooling passage 32 and the HV equipment 31 is able to be increased, so cooling efficiency of the HV equipment 31 can be improved. For example, a wick type heat pipe may be used.

The heat pipe enables heat to be reliably transferred from the HV equipment 31 to the cooling passage 32, so there may be distance between the HV equipment 31 and the cooling passage 32, and there is no need for a complex arrangement of the cooling passage 32 in order to have the cooling passage 32 contact the HV equipment 31. As a result, the degree of freedom in the arrangement of the HV equipment 31 is able to be improved.

The HV equipment 31 includes electrical equipment that generates heat as a result of sending and receiving electric power. The electrical equipment includes at least one of, for example, an inverter for converting direct current (DC) electric power into alternating current (AC) electric power, a motor-generator that is a rotary electric machine, a battery that is a power storage device, a converter for stepping up the voltage of the battery, and a DC/DC converter for stepping down the voltage of the battery. The battery is a secondary battery such as a lithium-ion battery or a nickel-metal hydride battery. A capacitor may also be used instead of a battery.

Figure 4:
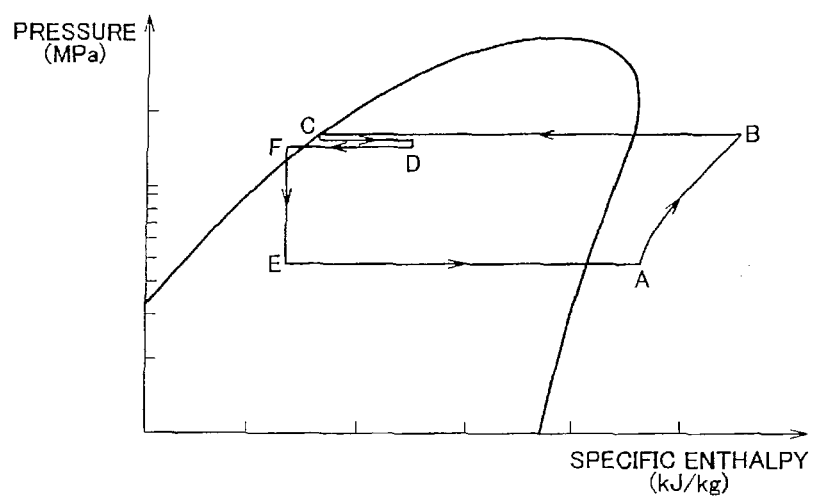
FIG. 4 is a Mollier diagram showing the state of refrigerant of a vapor compression refrigeration cycle according to the first example embodiment.

FIG. 4 is a Mollier diagram showing the state of refrigerant of the vapor compression refrigeration cycle 10 according to the first example embodiment. The horizontal axis in FIG. 4 represents the specific enthalpy (unit: kJ/kg) of the refrigerant, and the vertical axis in FIG. 4 represents the absolute pressure (unit: MPa) of the refrigerant. The curve in the drawing is a saturated vapor line and a saturated liquid line of the refrigerant. FIG. 4 shows the thermodynamic equation of state of the refrigerant at each point (i.e., points A, B, C, D, F, and E) in the vapor compression refrigeration cycle 10, in which refrigerant flows from the refrigerant passage 22 at the outlet of the condenser 14 into the refrigerant passage 34 via the gas-liquid separator 40, cools the HV equipment 31, and then returns from the refrigerant passage 36 to the refrigerant passage 24a at the inlet of the condenser 15 via point D.

As shown in FIG. 4, refrigerant in a superheated vapor state that is drawn into the compressor 12 (point A) is adiabatically compressed along a geometric entropy line in the compressor 12. As this refrigerant is compressed, the pressure and temperature of the refrigerant rises, and it becomes high-temperature, high-pressure superheated vapor with a large degree of superheat (point B). The refrigerant then flows to the condenser 14. The high-pressure refrigerant vapor that has entered the condenser 14 is cooled in the condenser 14, and changes from the superheated vapor to dry saturated vapor while remaining at constant pressure, such that the refrigerant vapor then releases latent heat of condensation and is gradually liquefied, becoming wet vapor of a gas-liquid mixture. Of the refrigerant that is in the two-phase gas-liquid state, the refrigerant that has condensed becomes saturated liquid (point C).

The refrigerant separates into gas-phase refrigerant and the liquid-phase refrigerant in the gas-liquid separator 40. Of the gas-liquid separated refrigerant, the refrigerant liquid 43 that is in a liquid phase flows through the refrigerant passage 34 from the gas-liquid separator 40 to the cooling passage 32 of the cooling portion 30, where it cools the HV equipment 31. The HV equipment 31 is cooled by releasing heat to the liquid refrigerant that is in the saturated liquid state after being condensed by passing through the condenser 14. Heat exchange with the HV equipment 31 heats the refrigerant and thus increases the degree of dryness of the refrigerant. The refrigerant receives latent heat from the HV equipment 31 and some of this refrigerant consequently vaporizes, such that the refrigerant becomes wet vapor that is a mixture of the saturated liquid and the saturated vapor (point D). (point D).

Then the refrigerant flows into the condenser 15. The wet vapor of the refrigerant is again condensed in the condenser 15, and when all of the refrigerant condenses, it becomes saturated liquid. Moreover, the refrigerant releases sensible heat and becomes supercooled liquid that is supercooled (point F). Then the refrigerant flows into the expansion valve 16. In the expansion valve 16, the refrigerant in the supercooled liquid state is throttled and expanded, so the temperature and pressure decrease without the specific enthalpy changing, thus creating low-temperature, low-pressure wet vapor of a gas-liquid mixture (point E).

The heat of the refrigerant in the wet vapor state that is discharged from the expansion valve 16 is absorbed from the outside, so the refrigerant vaporizes while remaining at constant pressure from the latent heat of vaporization in the evaporator 18, and becomes dry saturated vapor. Then the refrigerant vapor further rises in temperature from the sensible heat and becomes superheated vapor (point A), which is then drawn into the compressor 12. The refrigerant continuously changes states repeatedly from compressed, to condensed, to throttled and expanded, to vaporized, according to this kind of cycle.

In the description of the vapor compression refrigeration cycle above, a theoretical refrigeration cycle is described. However, in the actual vapor compression refrigeration cycle 10, it is of course necessary to take into account loss in the compressor 12, pressure loss of the refrigerant, and heat loss.

While the vapor compression refrigeration cycle 10 is operating, refrigerant cools the inside of the vehicle cabin by absorbing, in the evaporator 18, vaporization heat from the air inside the vehicle cabin. In addition, high-pressure liquid refrigerant that has flowed out from the condenser 14 and been gas-liquid separated by the gas-liquid separator 40 flows to the HV equipment 31 and performs heat exchange with the HV equipment 31, thereby cooling the HV equipment 31. The cooling system 1 cools the HV equipment 31 that is the heat source mounted in the vehicle, using the vapor compression refrigeration cycle 10 for air-conditioning the inside of the vehicle cabin.

The HV equipment 31 is cooled using the vapor compression refrigeration cycle 10 provided to cool the portion to be cooled at the evaporator 18. Therefore, there is no need to provide equipment such as a special water circulating pump or cooling fan in order to cool the HV equipment 31. Accordingly, the structure necessary for the cooling system 1 of the HV equipment 31 can be reduced so the structure of the apparatus can be simple, and as a result, the manufacturing cost of the cooling system 1 is able to be reduced. In addition, there is no need to operate a power supply such as a pump or a cooling fan in order to cool the HV equipment 31, so power does not need to be consumed to operate the power supply. Therefore, the power consumption for cooling the HV equipment 31 is able to be reduced.

The refrigerant passage 23 that forms part of a path that leads from the outlet of the condenser 14 toward the inlet of the expansion valve 16 is provided between the condenser 14 and the condenser 15. The refrigerant passage 23 that is a path that does not pass through the cooling portion 30, and the second passage that is a path for refrigerant that cools the HV equipment 31 via the cooling portion 30, are provided in parallel as paths through which refrigerant flows from the gas-liquid separator 40 toward the expansion valve 16. The cooling system of the HV equipment 31 that includes the refrigerant passages 34 and 36 are connected in parallel with the refrigerant passage 23. Therefore, only some of the refrigerant that flows out from the condenser 14 flows to the cooling portion 30. Refrigerant of an amount necessary to cool the HV equipment 31 is made to flow to the cooling portion 30, such that the HV equipment 31 is able to be appropriately cooled. Accordingly, the HV equipment 31 is able to be inhibited from being supercooled.

Providing the path for refrigerant that flows from the condenser 14 directly to the condenser 15 in parallel with the path for refrigerant that flows from the condenser 14 to the condenser 15 via the cooling portion 30 and having only some of the refrigerant flow to the refrigerant passages 34 and 36 makes it possible to reduce pressure loss when refrigerant flows to the cooling system of the HV equipment 31. Not all of the refrigerant flows to the cooling portion 30, so pressure loss related to the flow of refrigerant through the cooling portion 30 can be reduced, and in turn, the power consumption necessary to operate the compressor 12 in order to circulate the refrigerant can be reduced.

When the low-temperature, low-pressure refrigerant that has passed through the expansion valve 16 is used to cool the HV equipment 31, the cooling capability of the evaporator 18 with respect to the air inside of the vehicle cabin decreases, so the vehicle cabin cooling capability decreases. However, with the cooling system 1 in this example embodiment, high-pressure refrigerant discharged from the compressor 12 is condensed by both the condenser 14 that serves as the first condenser, and the condenser 15 that serves as the second condenser. The two condensers 14 and 15 are arranged between the compressor 12 and the expansion valve 16, and the cooling portion 30 that cools the HV equipment 31 is provided between the condenser 14 and the condenser 15. The condenser 15 is provided in the path of the refrigerant that flows from the cooling portion 30 toward the expansion valve 16.

By sufficiently cooling, in the condenser 15, the refrigerant that has been heated by receiving the latent heat of vaporization from the HV equipment 31, at the outlet of the expansion valve 16, the refrigerant has the temperature and pressure originally required to cool the inside of the vehicle cabin. Therefore, the amount of heat that can be received from the outside when the refrigerant vaporizes in the evaporator 18 can be made sufficiently large. Setting the heat releasing capability of the condenser 15 that is able to sufficiently cool the refrigerant in this way enables the HV equipment 31 to be cooled without adversely affecting the cooling capability to cool the air inside the vehicle cabin. Therefore, both the cooling capability for the HV equipment 31 and the vehicle cabin cooling capability are able to be ensured. The temperature required to cool the HV equipment 31 is preferably lower than at least an upper limit value of a target temperature range as the temperature range of the HV equipment 31.

In the condenser 14, refrigerant simply need be cooled until it is in a saturated liquid state, as shown in FIG. 4. Refrigerant that is in a wet vapor state as a result of having received the latent heat of vaporization from the HV equipment 31 such that some of the refrigerant has vaporized is again cooled by the condenser 15. Until the refrigerant that is in a wet vapor state is condensed and completely turns into saturated liquid, the refrigerant changes states at a constant temperature. The condenser 15 further supercools the liquid-phase refrigerant to a degree of supercooling necessary for cooling the inside of the vehicle cabin. The degree to which the refrigerant is supercooled does not have to be excessively large, so the capacities of the condensers 14 and 15 can be reduced. Accordingly, the vehicle cabin cooling capability can be ensured, and the size of the condensers 14 and 15 can be reduced, so the cooling system 1 that is small and thus advantageous for being mounted in a vehicle is able to be obtained.

The refrigerant that flows from the condenser 14 to the HV equipment 31 is heated as a result of receiving heat from the HV equipment 31 when it cools the HV equipment 31. When the refrigerant is heated to equal to or greater than a saturated vapor temperature in the HV equipment 31 and all of the refrigerant vaporizes, the amount of heat exchange between the refrigerant and the HV equipment 31 decreases, so the HV equipment 31 is no longer able to be cooled efficiently, and the pressure loss when the refrigerant flows through the conduit increases. Therefore, it is preferable to sufficiently cool the refrigerant in the condenser 14 to the point where not all of the refrigerant will vaporize after cooling the HV equipment 31.

More specifically, the state of the refrigerant at the outlet of the condenser 14 is made to be a state that is close to saturated liquid, typically, a state in which the refrigerant is on the saturated liquid line at the outlet of the condenser 14. When the condenser 14 has the capability to sufficiently cool the refrigerant in this way, the heat releasing capability to release heat from the refrigerant of the condenser 14 consequently becomes higher than the heat releasing capability of the condenser 15. Sufficiently cooling the refrigerant in the condenser 14 that has relatively greater heat releasing capability enables refrigerant that has received heat from the HV equipment 31 to be held in a wet vapor state, so a decrease in the amount of heat exchange between the refrigerant and the HV equipment 31 can be avoided, thus enabling the HV equipment 31 to be sufficiently cooled efficiently. The refrigerant in a wet vapor state after cooling the HV equipment 31 is again efficiently cooled in the condenser 15, and is cooled until it comes to be in a supercooled liquid state below the saturation temperature. Therefore, the cooling system 1 that enables both the vehicle cabin cooling capability and the cooling capability for the HV equipment 31 to be ensured can be provided.

The refrigerant that is in the two-phase gas-liquid state at the outlet of the condenser 14 is separated into a gas phase and a liquid phase in the one gas-liquid separator 40. The gas-phase refrigerant that has been separated by the gas-liquid separator 40 flows through the refrigerant passages 23 and 24 and is supplied to the condenser 15. The liquid-phase refrigerant that has been separated by the gas-liquid separator 40 flows through the refrigerant passage 34 and is supplied to the cooling portion 30 to cool the HV equipment 31. This liquid-phase refrigerant is refrigerant that is in a true saturated liquid state of an amount sufficient for cooling the HV equipment 31. Therefore, by removing only the liquid-state refrigerant from the gas-liquid separator 40 and having it flow to the cooling portion 30, the HV equipment 31 can be cooled fully utilizing the capability of the condenser 14, so the cooling system 1 with improved cooling capability for the HV equipment 31 can be provided.

By introducing refrigerant that is in a saturated liquid state at the outlet of the gas-liquid separator 40 to the cooling passage 32 that cools the HV equipment 31, refrigerant that is in a gas-phase state, of the refrigerant that flows through the second passage that is the cooling system of the HV equipment 31 that includes the refrigerant passages 34 and 36 and the cooling passage 32, can be kept to a minimum. Therefore, the flowrate of the refrigerant vapor that flows through the second passage increases, so an increase in pressure loss can be inhibited, and the power consumption necessary to operate the compressor 12 in order to circulate the refrigerant can be reduced. As a result, a decline in the performance of the vapor compression refrigeration cycle 10 can be avoided.

The refrigerant liquid 43 that is in the saturated liquid state is stored inside the gas-liquid separator 40, as shown in FIG. 2. The gas-liquid separator 40 serves as a liquid storing container inside of which the refrigerant liquid 43 is temporarily stored. By storing a predetermined amount of refrigerant liquid 43 inside of the gas-liquid separator 40, the flowrate of the refrigerant that flows from the gas-liquid separator 40 to the cooling portion 30 can be maintained even when the load fluctuates. The gas-liquid separator 40 has a liquid-storing function and becomes a buffer against load fluctuations, and thus is able to absorb load fluctuations. As a result, the cooling performance of the HV equipment 31 can be made stable.

Further referring to FIG. 2, a filter 46 is provided on the end portion that is arranged in the liquid phase in the gas-liquid separator 40, of the refrigerant passage 34 that carries the gas-liquid separated refrigerant liquid 43 from the gas-liquid separator 40 to the cooling portion 30. The end portion of the refrigerant passage 34 shown in FIG. 2 is an end portion on the upstream side in the flow of the refrigerant toward the cooling portion 30. The filter 46 is arranged on the upstream side of the flow of refrigerant in the cooling passage 32 that is included in the cooling portion 30, in the refrigerant path formed by the refrigerant passage 34, the cooling passage 32, and the refrigerant passage 36.

In the vapor compression refrigeration cycle 10, the strainers 75 and 76 are arranged inside of the receiver 70 shown in FIG. 3, and foreign matter is removed by these strainers 75 and 76. If foreign matter in the path from the receiver 70 to the cooling portion 30 creates a blockage in the cooling passage 32 such that only the gas-phase refrigerant can pass through the cooling passage 32, the cooling capability with respect to the HV equipment 31 will significantly decrease. Therefore, providing a structure in which foreign matter can be removed by the filter 46 by arranging the filter 46 in the refrigerant passage 34 that is the path for the refrigerant just before the cooling passage 32 makes it possible to prevent a blockage from occurring in the cooling passage 32, and therefore prevent the cooling performance with respect to the HV equipment 31 from deteriorating.

When comparing the structure of the gas-liquid separator 40 shown in FIG. 2 with the conventional receiver 70 shown in FIG. 3, with the receiver 70 shown in FIG. 3, all of the refrigerant that flows into the receiver 70 through the refrigerant passage 24 and flows out of the receiver 70 through the refrigerant passage 25 is filtered by flowing through the strainers 75 and 76. If the structure of this receiver 70 is applied to the gas-liquid separator 40, refrigerant that does not flow to the HV equipment 31 will also be filtered by the strainer, and as a result, pressure loss will increase.

In contrast, unlike the receiver 70, the gas-liquid separator 40 according to this example embodiment does not have a stacked structure of a strainer and a drying agent. The filter 46 for removing foreign matter is provided only for the refrigerant passage 34 that is a conduit that is upstream of the cooling portion 30 for cooling the HV equipment 31. The filter 46 is provided only for the refrigerant passage 34 that is a path that carries refrigerant from the gas-liquid separator 40 toward the cooling portion 30. No filter is provided for the refrigerant passage 23 that is a path that does not carry refrigerant toward the cooling portion 30. The liquid-phase refrigerant that flows out from the gas-liquid separator 40 through the refrigerant passage 34 is filtered by the filter 46, while the gas-phase refrigerant that flows out from the gas-liquid separator 40 through the refrigerant passage 23 is not filtered.

When refrigerant flows through the filter, pressure loss occurs. If this pressure loss increases, the power of the compressor 12 for circulating the refrigerant will increase and the performance of the vapor compression refrigeration cycle 10 will decrease. Therefore, by using the gas-liquid separator 40 having the structure shown in FIG. 2 and arranging the filter 46 only in the path that carries refrigerant to the cooling portion 30, the refrigerant that flows to the cooling portion 30 is able to be filtered, so the cooling passage 32 can be prevented from clogging. In addition, the refrigerant that flows directly to the condenser 15 is not filtered so an increase in pressure loss related to the flow of refrigerant can be suppressed.

The arrangement of the filter 46 is not limited to the filter 46 being at the end portion of the refrigerant passage 34 as shown in FIG. 2. As long as the structure is such that a filter is only arranged in the path that carries refrigerant from the gas-liquid separator 40 toward the cooling portion 30 through the refrigerant passage 34, and not in that path that carries refrigerant from the gas-liquid separator 40 directly toward the condenser 15 through the refrigerant passage 23, an effect in which pressure loss when the coolant flows can be reduced more than when a conventional receiver is used can similarly be obtained. For example, a structure may also be employed that removes foreign matter by arranging a strainer midway in the refrigerant passage 34 and filtering the refrigerant that flows to the cooling portion 30.

Returning now to FIG. 1, the cooling system 1 includes a flow control valve 28. The flow control valve 28 is provided in the refrigerant passage 23 that forms part of a path that carries refrigerant from the condenser 14 toward the expansion valve 16. The flow control valve 28 appropriately regulates the flowrate of the refrigerant that flows through the refrigerant passage 23 that serves as a first passage and the flowrate of the refrigerant that flows through the second passage that includes the cooling passage 32, by changing its opening amount (i.e., the opening amount of the flow control valve 28) to increase or decrease pressure loss of the refrigerant that flows through the refrigerant passage 23.

For example, if the flow control valve 28 is fully closed such that the valve opening amount is 0%, the entire amount of the refrigerant that is discharged from the condenser 14 will flow from the gas-liquid separator 40 into the refrigerant passage 34. If the opening amount of the flow control valve 28 is increased, the flowrate of refrigerant that directly flows to the condenser 15 via the refrigerant passage 23, of the refrigerant that flows from the condenser 14 to the refrigerant passage 22, will increase, and consequently, the flowrate of the refrigerant that flows via the refrigerant passage 34 to the cooling passage 32 where it cools the HV equipment 31 will decrease. Conversely, if the opening amount of the flow control valve 28 is decreased, the flowrate of refrigerant that directly flows to the condenser 15 via the refrigerant passage 23, of the refrigerant that flows from the condenser 14 to the refrigerant passage 22, will decrease, and consequently, the flowrate of the refrigerant that flows through the cooling passage 32 where it cools the HV equipment 31 will increase.

If the opening amount of the flow control valve 28 is increased, the flowrate of the refrigerant that cools the HV equipment 31 will decrease, so the cooling capability for the HV equipment 31 will be reduced. If the opening amount of the flow control valve 28 is decreased, the flowrate of the refrigerant that cools the HV equipment 31 will increase, so the cooling capability for the HV equipment 31 will be improved. In this way, the amount of refrigerant that flows to the HV equipment 31 can be optimally regulated using the flow control valve 28, so supercooling of the HV equipment 31 can be inhibited, and in addition, both pressure loss related to the flow of refrigerant through the second passage, and the power consumption of the compressor 12 for circulating the refrigerant are able to be reduced.

Figure 5:
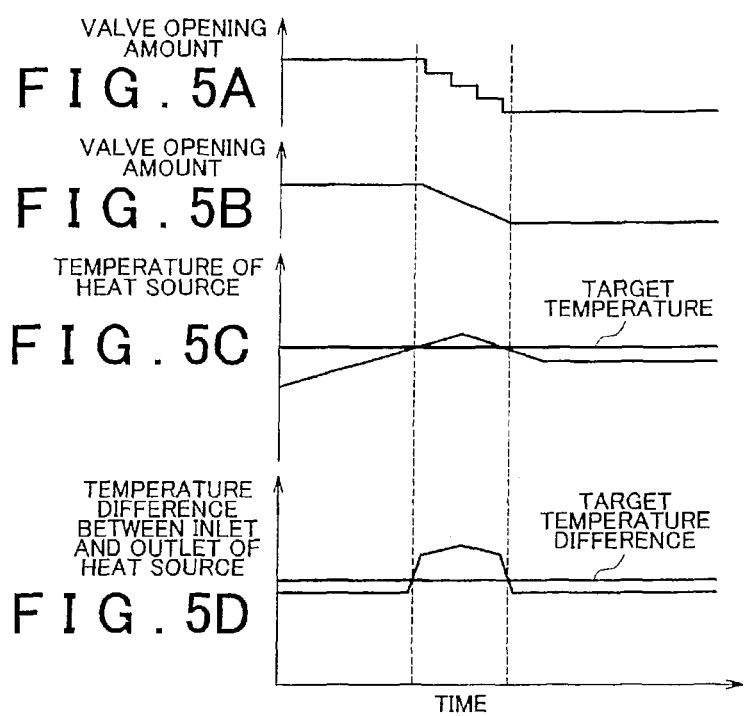
FIGS. 5A to 5D are views schematically showing opening amount control of a flow control valve.

Next, an example of control related to the adjustment of the opening amount of the flow control valve 28 will be described. FIGS. 5A to 5D are views schematically showing opening amount control of the flow control valve 28. The horizontal axis shown in the graphs in FIGS. 5A to 5D represents time. The vertical axis of the graph in FIG. 5A represents the valve opening amount when the flow control valve 28 is an electrical expansion valve with a stepping motor. The vertical axis of the graph in FIG. 5B represents the opening amount when the flow control valve 28 is a temperature-type expansion valve that opens and closes according to a change in temperature. The vertical axis of the graph in FIG. 5C represents the temperature of the HV equipment 31. The vertical axis of the graph in FIG. 5D represents a temperature difference between the inlet and the outlet (i.e., an inlet/outlet temperature difference) of the HV equipment 31.

The HV equipment 31 is cooled by refrigerant flowing through the cooling portion 30. The adjustment of the opening amount of the flow control valve 28 is performed by, for example, monitoring the temperature of the HV equipment 31, or the temperature difference between the outlet temperature and the inlet temperature of the HV equipment 31. For example, referring to the graph in FIG. 5C, a temperature sensor that intermittently measures the temperature of the HV equipment 31 is provided, and the temperature of the HV equipment 31 is monitored. Also, for example, referring to the graph in FIG. 5D, a temperature sensor that measures the inlet temperature and the outlet temperature of the HV equipment 31 is provided, and the temperature difference between the inlet and outlet of the HV equipment 31 is monitored.

If the temperature of the HV equipment 31 exceeds a target temperature, or if the inlet/outlet temperature difference of the HV equipment 31 exceeds a target temperature difference (such as 3 to 5° C.), the opening amount of the flow control valve 28 will be decreased, as shown in the graphs in FIGS. 5A and 5B. Throttling the opening amount of the flow control valve 28 increases the flowrate of the refrigerant that flows to the cooling portion 30 through the refrigerant passage 34, as described above, so the HV equipment 31 can be cooled even more effectively. As a result, the temperature of the HV equipment 31 can be reduced to equal than or less the target temperature, as shown in the graph in FIG. 5C, or the inlet/outlet temperature difference of the HV equipment 31 can be reduced to equal to or less than the target temperature difference, as shown in the graph in FIG. 5D.

In this way, by optimally adjusting the opening amount of the flow control valve 28, it is possible to ensure refrigerant of an amount that enables the heat releasing capability required to keep the HV equipment 31 within an appropriate temperature range to be obtained, such that the HV equipment 31 can be appropriately cooled. Therefore, the problem of the HV equipment 31 overheating and becoming damaged is able to be reliably inhibited from occurring.

Second Example Embodiment

Figure 6:
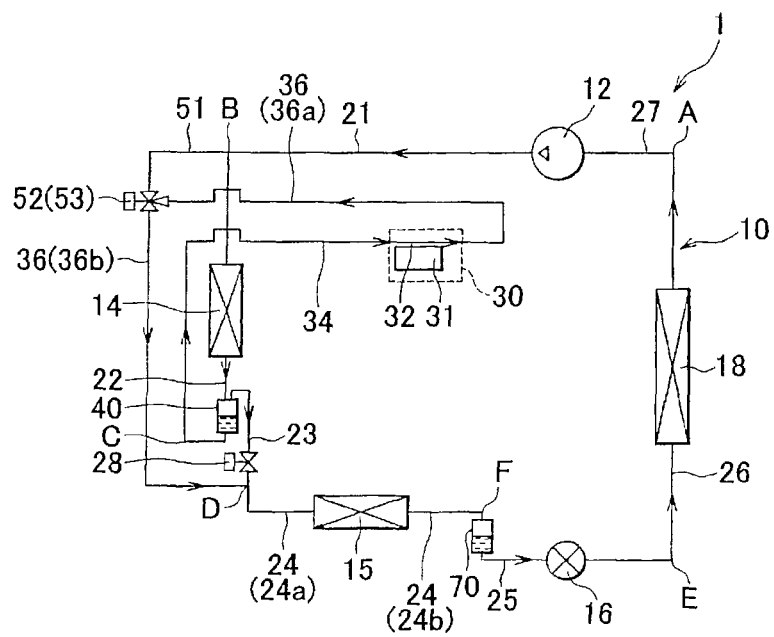
FIG. 6 is a view showing a frame format of the structure of a cooling system according to a second example embodiment of the invention.

FIG. 6 is a view showing a frame format of the structure of the cooling system 1 according to a second example embodiment of the invention. The cooling system 1 according to the second example embodiment differs from the cooling system 1 according to the first example embodiment in that it is provided with a communicating passage 51.

More specifically, the communicating passage 51 communicates the refrigerant passage 21 that carries refrigerant from the outlet of the compressor 12 toward the inlet of the condenser 14, with the refrigerant passage 36 on the downstream side of the cooling portion 30, of the refrigerant passages 34 and 36 that carry refrigerant to the cooling portion 30. A changeover valve 52 that changes the communication state between the refrigerant passage 36 and the refrigerant passages 21 and 24 is provided in the refrigerant passage 36. The changeover valve 52 in the second example embodiment is a three-way valve 53. The refrigerant passage 36 is divided into a refrigerant passage 36a upstream of the three-way valve 53, and a refrigerant passage 36b downstream of the three-way valve 53.

Changing the open/closed state of the three-way valve 53 enables refrigerant that flows through the refrigerant passage 36a after cooling the HV equipment 31 to be channeled to the condenser 15 through the refrigerant passage 36b, or channeled to the condenser 14 through the communicating passage 51. Changing the refrigerant path using the three-way valve 53 that is one example of the changeover valve 52 enables refrigerant after cooling the HV equipment 31 to be selectively channeled to the appropriate path, i.e., to the condenser 15 via the refrigerant passages 36b and 24a, or to the condenser 14 via the communicating passage 51 and the refrigerant passage 21.

Figure 7:
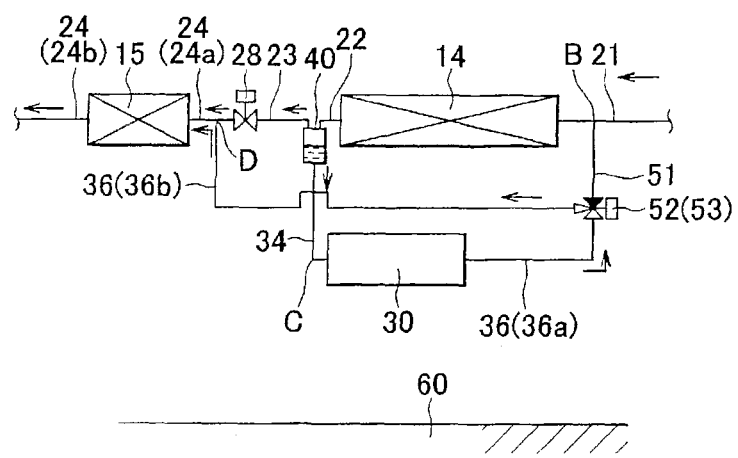
FIG. 7 is a view showing a frame format of the flow of refrigerant that cools HV equipment, while the vapor compression refrigeration cycle is operating.

FIG. 7 is a view showing a frame format of the flow of refrigerant that cools the HV equipment 31, while the vapor compression refrigeration cycle 10 is operating. When the compressor 12 is being driven such that the vapor compression refrigeration cycle 10 is operating, the opening amount of the control valve 28 is adjusted so that a sufficient amount of refrigerant flows to the cooling portion 30. The three-way valve 53 is controlled to channel the refrigerant from the cooling portion 30 to the expansion valve 16 through the condenser 15, and the refrigerant path is selected such that refrigerant flows through the entire cooling system 1. As a result, the cooling capability of the vapor compression refrigeration cycle 10 can be ensured, and the HV equipment 31 can be efficiently cooled.

Figure 8:
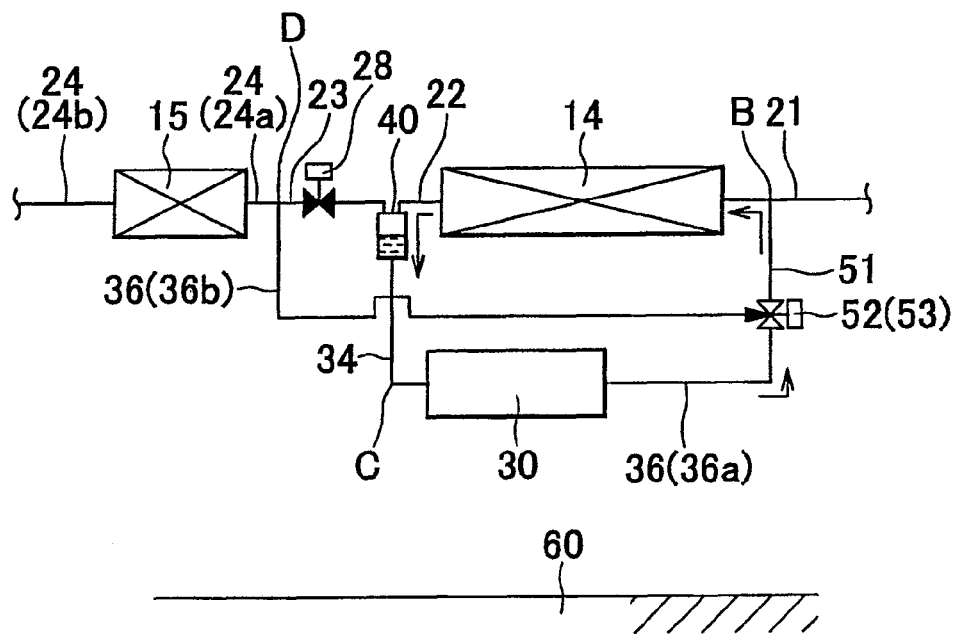
FIG. 8 is a view showing a frame format of the flow of refrigerant that cools the HV equipment, while the vapor compression refrigeration cycle is stopped.

FIG. 8 is a view showing a frame format of the flow of refrigerant that cools the HV equipment 31, while the vapor compression refrigeration cycle 10 is stopped. As shown in FIG. 8, when the compressor 12 is stopped such that the vapor compression refrigeration cycle 10 is stopped, the three-way valve 53 is controlled to circulate refrigerant from the cooling portion 30 to the condenser 14, and the flow control valve 28 is fully closed. By channeling the refrigerant through the communicating passage 51, a closed circular path is created in which the refrigerant flows from the condenser 14 to the cooling portion 30 via the refrigerant passage 22 and the refrigerant passage 34 in that order, and then returns to the condenser 14 via the refrigerant passage 36a, the communicating passage 51, and the refrigerant passage 21 in that order.

Refrigerant can be circulated between the condenser 14 and the cooling portion 30, without operating the compressor 12, via this circular path. When cooling the HV equipment 31, the refrigerant receives the latent heat of vaporization from the HV equipment 31 and vaporizes. The refrigerant vapor vaporized by the heat exchange with the HV equipment 31 flows to the condenser 14 through the refrigerant passage 36a, the communicating passage 51, and the refrigerant passage 21 in that order. In the condenser 14, the refrigerant vapor is cooled so that it condenses by the draft from a radiator fan for cooling the engine or the airflow created when the vehicle runs. The refrigerant liquid that has been liquefied by the condenser 14 returns to the cooling portion 30 via the refrigerant passages 22 and 34.

In this way, a heat pipe in which the HV equipment 31 serves as a heating portion and the condenser 14 serves as a cooling portion is created by the circular path that passes through the cooling portion 30 and the condenser 14. Therefore, even when the vapor compression refrigeration cycle 10 is stopped, i.e., even when the vehicle cooling is stopped, the HV equipment 31 can be reliably cooled without having to start the compressor 12. Because the compressor 12 does not always have to be operating in order to cool the HV equipment 31, the power consumption of the compressor 12 can be reduced, thereby improving the fuel efficiency of the vehicle. In addition, the life of the compressor 12 is able to be extended, so the reliability of the compressor 12 can be improved.

FIGS. 7 and 8 both show a ground surface 60. The cooling portion 30 is arranged lower than the condenser 14 in the vertical direction that is perpendicular to the ground surface 60. The cooling portion 30 is arranged below and the condenser 14 is arranged above in the circular path that carries refrigerant between the condenser 14 and the cooling portion 30. The condenser 14 is arranged in a higher position than the cooling portion 30.

In this case, the refrigerant vapor that has been heated and vaporized in the cooling portion 30 rises inside the circular path and reaches the condenser 14, where it is cooled such that it condenses and becomes liquid refrigerant. This liquid refrigerant is runs down inside the circular path by gravity and returns to the cooling portion 30. That is, a thermosyphon type heat pipe is formed by the cooling portion 30, the condenser 14 and the refrigerant path that connects the cooling portion 30 and the condenser 14 together. Forming this heat pipe makes it possible to improve the heat-transfer efficiency from the HV equipment 31 to the condenser 14. As a result, the HV equipment 31 is able to be efficiently cooled without increasing the power, even when the vapor compression refrigeration cycle 10 is stopped.

Third Example Embodiment

Figure 9:
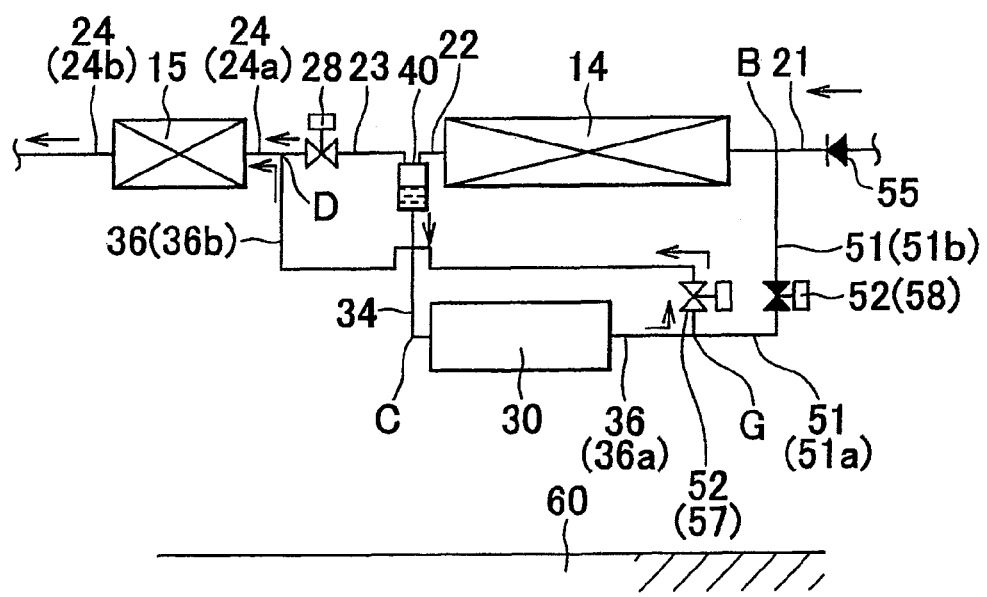
FIG. 9 is a frame format of the flow of refrigerant that cools the HV equipment, while the vapor compression refrigeration cycle is operating, that shows the structure of a cooling system according to a third example embodiment of the invention.
Figure 10:
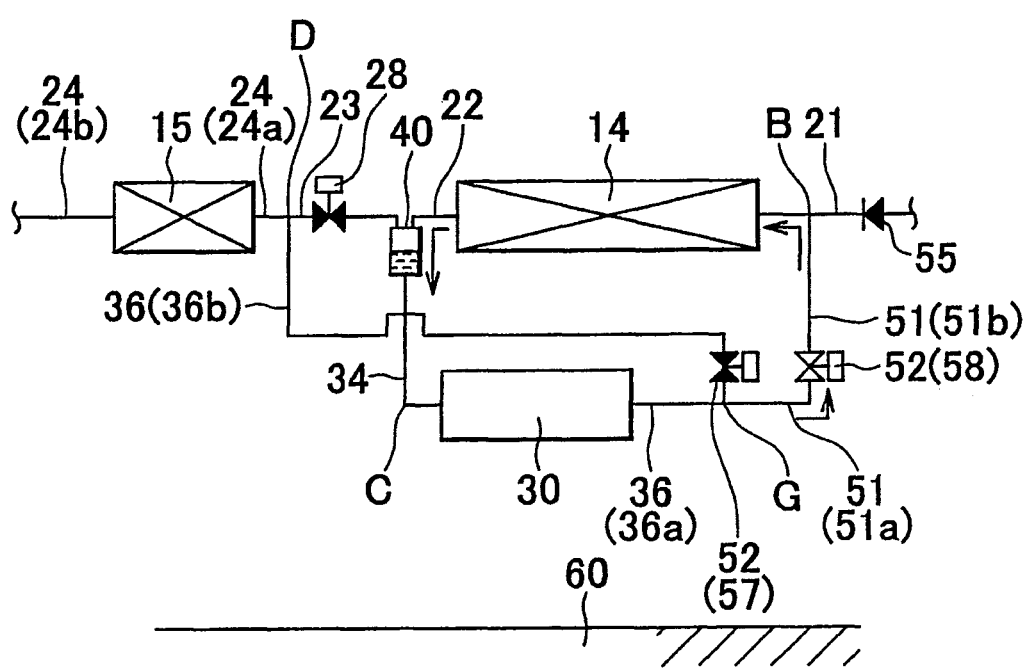
FIG. 10 is a frame format of the flow of refrigerant that cools the HV equipment, while the vapor compression refrigeration cycle is stopped, that shows the structure of the cooling system according to the third example embodiment.

FIG. 9 is a frame format of the flow of refrigerant that cools the HV equipment 31, while the vapor compression refrigeration cycle 10 is operating, that shows the structure of the cooling system 1 according to a third example embodiment of the invention. FIG. 10 is a frame format of the flow of refrigerant that cools the HV equipment 31, while the vapor compression refrigeration cycle 10 is stopped, that shows the structure of the cooling system 1 according to the third example embodiment. Compared with the structure shown in FIGS. 7 and 8, with the cooling system 1 according to the third example embodiment, two valves 57 and 58 are provided instead of the three-way valve 53 as the changeover valve 52.

When the valve 57 is fully open (i.e., a valve opening amount of 100%) and the valve 58 is fully closed (i.e., a valve opening amount of 0%) while the vapor compression refrigeration cycle 10 is operating, as shown in FIG. 9, the opening amount of the flow control valve 28 is adjusted so that a sufficient amount of refrigerant flows to the cooling portion 30. As a result, refrigerant after cooling the HV equipment 31 can be reliably channeled to the condenser 15 through the refrigerant passages 36a, 36b, and 24a. On the other hand, when the vapor compression refrigeration cycle 10 is stopped, the valve 58 is fully opened, the valve 57 is fully closed, and the flow control valve 28 is also fully closed, as shown in FIG. 10. As a result, a circular path that circulates refrigerant between the cooling portion 30 and the condenser 14 can be formed.

In this way, the three-way valve 53, or the pair of valves 57 and 58, may be used as the changeover valve 52 that switches the communication state between the refrigerant passage 36 and the refrigerant passages 21 and 24. In either case, the HV equipment 31 is able to be efficiently cooled both when the vapor compression refrigeration cycle 10 is operating and when the vapor compression refrigeration cycle 10 is stopped.

The valves 57 and 58 need only have a simple structure that enables them to open and close the refrigerant passage, so they are inexpensive. As a result, using the two valve 57 and 58 instead of the three-way valve 53 makes it possible to provide a less expensive cooling system 1. On the other hand, the space needed to arrange the three-way valve 53 is smaller than the space for arranging the two valves 57 and 58, so a cooling system 1 that is smaller and is easily to mount in a vehicle can be provided.

The cooling system 1 according to the third example embodiment also has a check valve 55. This check valve 55 is arranged on the side nearer the compressor 12 than the location where the refrigerant passage 21 and the communicating passage 51 are connected, in the refrigerant passage 21 between the compressor 12 and the condenser 14. The check valve 55 allows refrigerant to flow from the compressor 12 toward the condenser 14, and prohibits refrigerant from flowing in the opposite direction.

Accordingly, as shown in FIG. 10, when the flow control valve 28 is fully closed (i.e., an opening amount of 0%) and the changeover valve 52 is adjusted such that refrigerant flows from the refrigerant passage 36a to the communicating passage 51 but does not flow to the refrigerant passage 36b, a closed-loop refrigerant path that circulates refrigerant between the condenser 14 and the cooling portion 30 is able to be reliably formed.

If the check valve 55 is not provided, refrigerant may flow from the communicating passage 51 to the refrigerant passage 21 on the compressor 12 side. Providing the check valve 55 makes it possible to reliably prohibit the flow of refrigerant from the communicating passage 51 toward the compressor 12 side. As a result, a decline in the ability to cool the HV equipment 31 when the vapor compression refrigeration cycle 10 is stopped, using the heat pipe formed by the circular refrigerant path can be prevented. Therefore, the HV equipment 31 is able to be effectively cooled even when cooling for the cabin of the vehicle is stopped.

Also, if there is not enough refrigerant in the closed-loop refrigerant path while the vapor compression refrigeration cycle 10 is stopped, refrigerant can be provided to the closed-loop path via the check valve 55 by operating the compressor 12 for only a short period of time. As a result, the amount of refrigerant in the closed loop can be increased so the amount of heat exchange performed by the heat pipe can be increased. Therefore, the amount of refrigerant in the heat pipe can be ensured, making it possible to avoid insufficient cooling of the HV equipment 31 due to an insufficient amount of refrigerant.

In the first to the third example embodiments, the cooling system 1 that cools electrical equipment mounted in a vehicle, of which the HV equipment is given as an example, is described. The electrical equipment is not limited to the electrical equipment described, e.g., an inverter, a motor-generator, and the like. That is, the electrical equipment may be any appropriate electrical equipment as long as it at least generates heat by operating. If a plurality of electrical equipment is to be cooled, the plurality of electrical equipment preferably has a common target temperature range for cooling. The target temperature range for cooling is a temperature range that is suitable as a temperature environment for operating the electrical equipment.

Moreover, the heat source that is cooled by the cooling system 1 of the invention is not limited to electrical equipment mounted in a vehicle, but may be any equipment that generates heat, or any heat-generating portion of equipment.

While example embodiments of the invention are described above, the structures of the example embodiments may also be combined as appropriate. Also, the example embodiments disclosed herein are in all respects merely examples and should in no way be construed as limiting. The scope of the invention is indicated not by the foregoing description but by the scope of the claims for patent, and is intended to include all modifications that are within the scope and meanings equivalent to the scope of the claims for patent.

INDUSTRIAL APPLICABILITY

The cooling system of the invention may be applied, with particular advantage, to cooling electrical equipment that uses a vapor compression refrigeration cycle for cooling the inside of a vehicle, in a vehicle such as a hybrid vehicle, a fuel cell vehicle, or an electric vehicle or the like, that is provided with electrical equipment such as a motor-generator and an inverter and the like.

The invention claimed is:

1. A cooling system comprising:
a compressor that circulates refrigerant;
a condenser that condenses the refrigerant;
a container in which the refrigerant is stored in a gas-phase and a liquid-phase condensed by the condenser;
a pressure reducer that reduces a pressure of the refrigerant;
an evaporator that vaporizes the refrigerant that is reduced in pressure by the pressure reducer;
a first passage and a second passage through which the refrigerant simultaneously flows from the storing container toward the pressure reducer, and that are provided in parallel, wherein the first passage contains the gas-phase of the refrigerant and the second passage contains the liquid-phase of the refrigerant;
a cooling portion that is provided along the second passage and cools a heat source using the refrigerant;
a second condenser provided in a path through which the refrigerant flows from the cooling portion toward the pressure reducer, and
a connecting point at which the second passage is combined with the first passage, wherein the connecting point is downstream from the heat source and upstream from the second condenser and the first passage extends from the gas-liquid separator directly to the connecting point.

2. The cooling system according to claim 1, further comprising a flow control valve that is arranged in the first passage and regulates a flowrate of the refrigerant that flows through the first passage and a flowrate of the refrigerant that flows through the second passage.

3. The cooling system according to claim 1, further comprising: a third passage through which the refrigerant flows from the compressor toward the condenser;
and a communicating passage that communicates the third passage with a portion of the second passage that is downstream of the cooling portion.

4. The cooling system according to claim 3, further comprising a changeover valve that switches a communication state between the third passage and the portion of the second passage that is downstream of the cooling portion.

5. The cooling system according to claim 3, wherein the cooling portion is arranged lower than the condenser.

6. The cooling system according to claim 5, wherein the condenser has a greater heat releasing capability to release heat from the refrigerant than the second condenser does.

7. The cooling system according to claim 1, further comprising a filter arranged upstream of the cooling portion in the second passage.

8. The cooling system according to claim 7, wherein the filter is attached to an upstream end portion of the second passage.

9. The cooling system according to claim 1, wherein the liquid storing container stores a predetermined amount of refrigerant liquid, wherein the predetermined amount of stored refrigerant liquid is sufficient to maintain flowrate to the cooling portion during load fluctuations.

10. The cooling system according to claim 2, wherein the flow control valve regulates a flowrate of the refrigerant that flows through the first passage and a flowrate of the refrigerant that flows through the second passage by changing a degree of opening of the flow control valve, wherein the degree of opening of the flow control valve is changed according to a temperature of the heat source.

* * * * *